US009466723B1

(12) United States Patent
Huang et al.

(10) Patent No.: US 9,466,723 B1
(45) Date of Patent: Oct. 11, 2016

(54) LINER AND CAP LAYER FOR PLACEHOLDER SOURCE/DRAIN CONTACT STRUCTURE PLANARIZATION AND REPLACEMENT

(71) Applicant: GLOBALFOUNDRIES Inc., Grand Cayman (KY)

(72) Inventors: Haigou Huang, Rexford, NY (US); Qiang Fang, Ballston Lake, NY (US); Jin Ping Liu, Ballston Lake, NY (US); Huang Liu, Mechanicville, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/751,718

(22) Filed: Jun. 26, 2015

(51) Int. Cl.
*H01L 29/78* (2006.01)
*H01L 21/02* (2006.01)
*H01L 21/28* (2006.01)
*H01L 29/49* (2006.01)
*H01L 21/283* (2006.01)
*H01L 29/66* (2006.01)
*H01L 21/3105* (2006.01)
*H01L 21/768* (2006.01)
*H01L 23/535* (2006.01)

(52) U.S. Cl.
CPC ....... *H01L 29/7851* (2013.01); *H01L 21/0217* (2013.01); *H01L 21/02126* (2013.01); *H01L 21/31053* (2013.01); *H01L 21/76831* (2013.01); *H01L 21/76877* (2013.01); *H01L 23/535* (2013.01); *H01L 29/66545* (2013.01); *H01L 29/66795* (2013.01)

(58) Field of Classification Search
USPC .......................................... 438/197; 257/288
See application file for complete search history.

(56) References Cited

U.S. PATENT DOCUMENTS

| 5,955,759 | A  | * | 9/1999 | Ismail | H01L 21/223 257/332 |
| 6,083,827 | A  | * | 7/2000 | Lin | H01L 21/76895 257/E21.304 |
| 6,288,431 | B1 | * | 9/2001 | Iwasa | H01L 21/28273 257/401 |
| 6,359,301 | B1 | * | 3/2002 | Kuroda | H01L 21/32053 257/306 |
| 7,579,272 | B2 | * | 8/2009 | Furukawa | B82Y 10/00 257/759 |
| 2001/0017417 | A1 | * | 8/2001 | Kuroda | H01L 21/28525 257/758 |
| 2001/0022399 | A1 | * | 9/2001 | Koubuchi | G03F 9/7076 257/758 |
| 2002/0094610 | A1 | * | 7/2002 | Enomoto | H01L 21/76831 438/118 |
| 2003/0111686 | A1 | * | 6/2003 | Nowak | H01L 29/66795 257/328 |
| 2005/0026377 | A1 | * | 2/2005 | Kawasaki | H01L 21/845 438/301 |

(Continued)

*Primary Examiner* — Michelle Mandala
*Assistant Examiner* — Thai T Vuong
(74) *Attorney, Agent, or Firm* — Amerson Law Firm, PLLC

(57) ABSTRACT

A method includes forming a placeholder source/drain contact structure above a semiconductor material. A conformal deposition process is performed to form a liner layer above the placeholder contact structure. A dielectric layer is formed above the liner layer. A first planarization process is performed to remove material of the dielectric layer and expose a first top surface of the liner layer above the placeholder contact structure. A first cap layer is formed above the dielectric layer. A second planarization process is performed to remove material of the first cap layer and the liner layer to expose a second top surface of the placeholder contact structure. The placeholder contact structure is removed to define a source/drain contact recess in the dielectric layer. The sidewalls of the dielectric layer in the source/drain contact recess are covered by the liner layer. A conductive material is formed in the contact recess.

15 Claims, 6 Drawing Sheets

(56) References Cited

U.S. PATENT DOCUMENTS

| | | | | |
|---|---|---|---|---|
| 2005/0124099 A1* | 6/2005 | Beintner | H01L 21/82343 | 438/164 |
| 2005/0124120 A1* | 6/2005 | Du | H01L 21/82343 | 438/283 |
| 2005/0239242 A1* | 10/2005 | Zhu | H01L 21/845 | 438/199 |
| 2005/0242406 A1* | 11/2005 | Hareland | H01L 29/1054 | 257/401 |
| 2007/0057325 A1* | 3/2007 | Hsu | H01L 29/785 | 257/347 |
| 2007/0108514 A1* | 5/2007 | Inoue | H01L 29/66545 | 257/330 |
| 2009/0001464 A1* | 1/2009 | Booth, Jr. | H01L 29/785 | 257/347 |
| 2012/0025289 A1* | 2/2012 | Liang | H01L 27/11524 | 257/316 |
| 2012/0104514 A1* | 5/2012 | Park | H01L 21/28518 | 257/411 |
| 2013/0020658 A1* | 1/2013 | Guo | H01L 29/4958 | 257/412 |
| 2013/0075821 A1* | 3/2013 | Baars | H01L 29/66545 | 257/368 |

\* cited by examiner

LINER AND CAP LAYER FOR PLACEHOLDER SOURCE/DRAIN CONTACT STRUCTURE PLANARIZATION AND REPLACEMENT

BACKGROUND OF THE INVENTION

1. Field of the Invention

The present disclosure generally relates to the fabrication of semiconductor devices, and, more particularly, to a method for forming a liner and cap layer for placeholder source/drain contact structure planarization and replacement.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

In some applications, fins for FinFET devices are formed such that the fins are laterally spaced apart from one another with an isolation material positioned between the fin and above the substrate. FIG. 1A is a perspective view of an illustrative prior art FinFET semiconductor device 100 that is formed above a semiconductor substrate 105 at an intermediate point during fabrication. In this example, the FinFET device 100 includes three illustrative fins 110, an isolation material 130, a gate structure 115, sidewall spacers 120 and a gate cap layer 125. The fins 110 have a three-dimensional configuration: a height, a width, and an axial length. The portions of the fins 110 covered by the gate structure 115 are the channel regions of the FinFET device 100, while the portions of the fins 110 positioned laterally outside of the spacers 120 are part of the source/drain regions of the device 100. Although not depicted, the portions of the fins 110 in the source/drain regions may have additional epi semiconductor material formed thereon in either a merged or unmerged condition.

The gate structure 115 is typically comprised of a layer of insulating material (not separately shown), e.g., a layer of high-k insulating material or silicon dioxide, and one or more conductive material layers (e.g., metal and/or polysilicon) that serve as the gate electrode for the device 100. The fins 110 have a three-dimensional configuration. The portions of the fins 110 covered by the gate structure 115 is the channel region of the FinFET device 100. In a conventional process flow, additional epitaxial grown semiconductor material may be formed on the portions of the fins 110 that are positioned outside of the spacers 120, i.e., the fins in the source/drain regions of the device 100 may have a merged, unmerged and or embedded condition. Forming the additional epi material on the fins 110 in the source/drain regions of the device reduces the resistance of source/drain regions and/or makes it easier to establish electrical contact to the source/drain regions.

FIG. 1B illustrates a cross-sectional view of the device 100 taken across the fins in the source/drain regions of the devices in a direction corresponding to the gate width direction of the devices. The fins 110 shown in FIG. 1A are so-called densely-spaced fins. An additional so-called isolated fin 135 is illustrated representing a different region of the substrate 105 where the spacing between adjacent fins is larger. For example, the densely-spaced fins 110 may be part of a logic device or SRAM NFET, while the isolated fin 135 may be part of an SRAM PFET. Epitaxial material 140, 145 is formed on the fins 110, 135, respectively. A contact etch stop layer 148 is formed above the dielectric layer 130 and the epitaxial material 140, 145.

Placeholder contact structures 150 with cap layers 155 were formed above the fins 110, 135 by performing deposition and etching processes. Subsequently, a dielectric layer 160 was formed to fill the spaces between the placeholder contact structures 150 and planarized to expose the cap layers 155. One material used for the dielectric layer 160 is SiOC due to its favorable gap filling characteristics and its resistance to CD loss during the removal of the placeholder material 150 and/or the contact etch stop layer 148 for the contact replacement process. However, the removal rate for SiOC planarization is limited by the chemical properties of the material and the slurry used. A lower removal rate reduces polishing uniformity across the wafer, especially in regions with different contact densities.

The present disclosure is directed to various methods and resulting devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming semiconductor devices. A method includes, among other things, forming a placeholder source/drain contact structure above a semiconductor material. A conformal deposition process is performed to form a liner layer above the placeholder contact structure. A dielectric layer is formed above the liner layer. A first planarization process is performed to remove material of the dielectric layer and expose a first top surface of the liner layer above the placeholder contact structure. A first cap layer is formed above the dielectric layer and the first top surface. A second planarization process is performed to remove material of the first cap layer and the liner layer to expose a second top surface of the placeholder contact structure. The placeholder contact structure is removed to define a contact recess in the dielectric layer. The sidewalls of the dielectric layer in the contact recess are covered by the liner layer. A conductive material is formed in the contact recess.

Another method includes, among other things, forming a fin in a semiconductor substrate. A placeholder contact structure is formed above the fin, the placeholder contact structure comprising a placeholder material and a first cap layer formed above the placeholder material. A conformal deposition process is performed to form a liner layer above the placeholder contact structure. A dielectric layer is formed above the liner layer. A first planarization process is performed to remove material of the dielectric layer and expose a first top surface of the liner layer above the placeholder contact structure. The dielectric layer is recessed to a level below a bottom surface of the first cap layer. A second cap layer is formed above the dielectric layer and the first top surface. A second planarization process is performed to remove material of the second cap layer and the liner layer to expose the first cap layer. The first cap layer and the placeholder material are removed to define a recess in the dielectric layer. The sidewalls of the dielectric layer in the recess are covered by the liner layer. A conductive material is formed in the recess.

One illustrative device includes, among other things, a fin defined in a semiconductor substrate. A conductive material is embedded in a recess defined in a dielectric material and contacts a portion of the fin. A liner layer comprising at least silicon, oxygen and carbon covers sidewalls of the recess without covering a bottom surface of the recess. The dielectric material comprises a material different than the liner layer.

BRIEF DESCRIPTION OF THE DRAWINGS

The disclosure may be understood by reference to the following description taken in conjunction with the accompanying drawings, in which like reference numerals identify like elements, and in which.

Figure 1A:
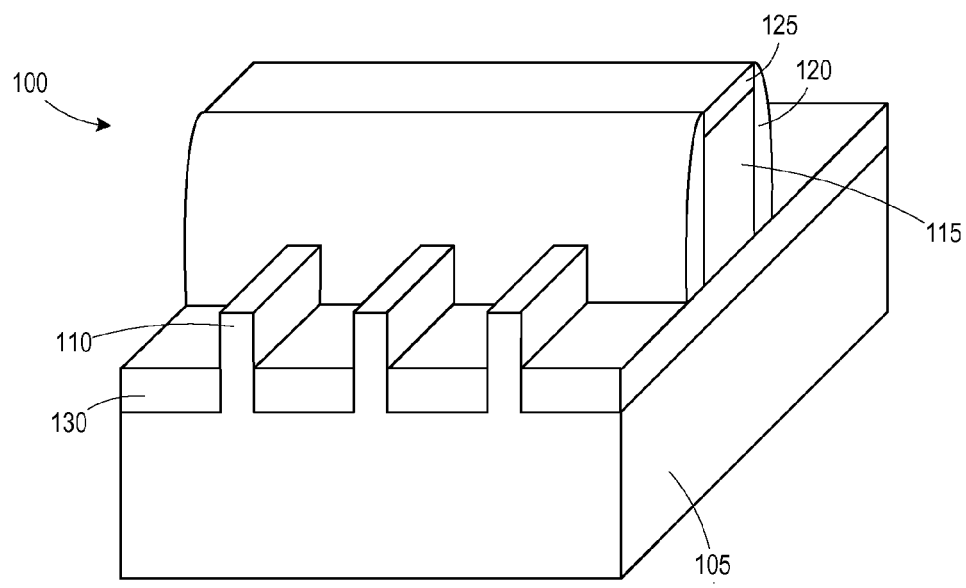
FIGS. 1A-1B schematically depict an illustrative prior art finFET device.
Figure 1B:
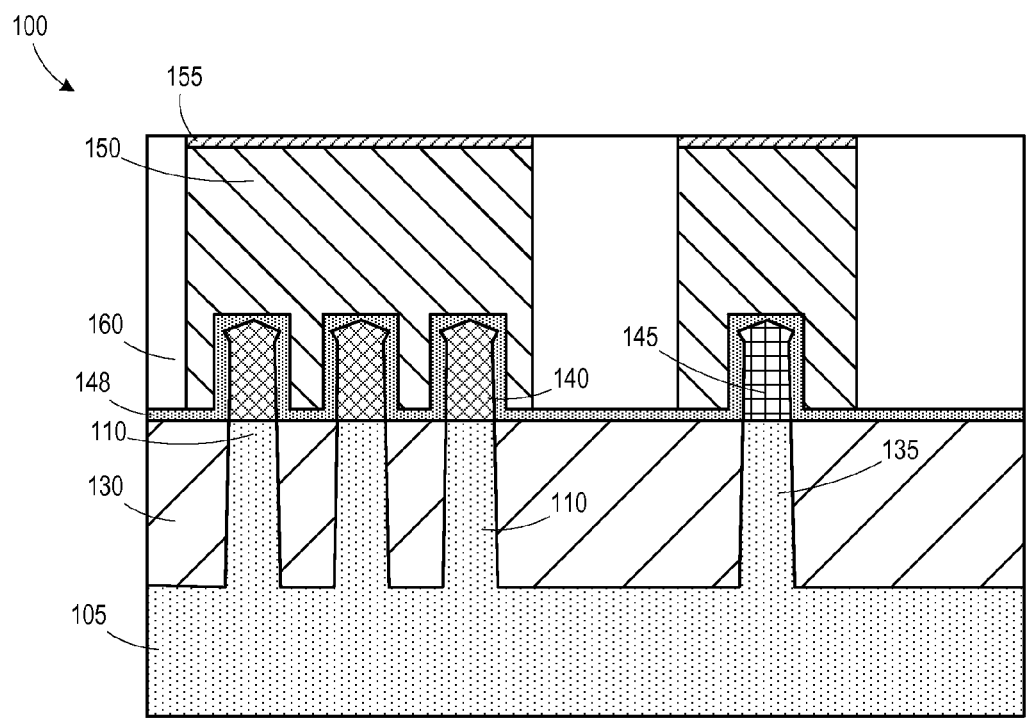

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming source/drain contacts for a semiconductor device such as a FinFET device or a nanowire device using a liner and cap layer for placeholder source/drain contact structure planarization and replacement and the resulting semiconductor devices. As will be readily apparent to those skilled in the art upon a complete reading of the present application, the present method is applicable to a variety of devices, including, but not limited to, logic devices, memory devices, etc. With reference to the attached figures, various illustrative embodiments of the methods and devices disclosed herein will now be described in more detail.

Figure 2A:
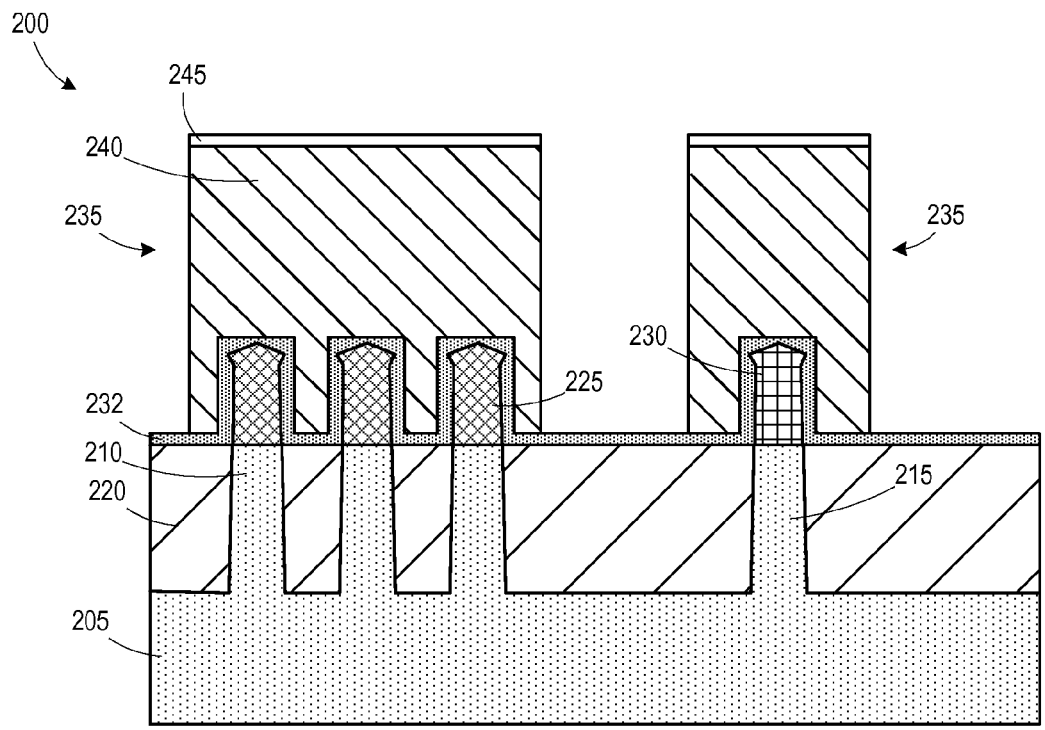
FIGS. 2A-2J depict various methods disclosed herein of forming source/drain contacts for a semiconductor device using a liner and cap layer for placeholder source/drain contact structure planarization and replacement.

FIGS. 2A-2J illustrate various novel methods disclosed herein for forming an integrated circuit product 200. As shown in FIG. 2A, the product 200 includes a substrate 205 and fins 210 associated with a first transistor device defined in the substrate 205. A fin 215 associated with a second transistor device is also defined in the substrate 205. The views in FIGS. 2A-2J are cross-sectional views taken across the fins 210, 215 in the source/drain regions of the devices in a direction corresponding to the gate width direction of the devices. The number of fins 210, 215, and the spacing between fins may vary depending on the particular characteristics of the device(s) being formed. A dielectric layer 220 (e.g., silicon dioxide) defines an isolation structure between the fins 210, 215. Epitaxial regions 225, 230 are formed on the fins 210, 215, respectively. A contact etch stop layer 232 is formed above the epitaxial regions 225, 230 and the dielectric layer 220. Of course, the particular structure and configuration of the fins and the manner in which they are formed may vary depending upon the particular application. Thus, the presently disclosed inventions should not be considered to be limited to any such details.

Various doped regions, e.g., halo implant regions, well regions and the like, may be formed, but are not depicted in the attached drawings. The substrate 205 may have a variety of configurations, such as the depicted bulk silicon configuration. The substrate 205 may also have a silicon-on-insulator (SOI) configuration that includes a bulk silicon layer, a buried insulation layer and an active layer, wherein semiconductor devices are formed in and above the active layer. The substrate 205 may be formed of silicon or silicon germanium or it may be made of materials other than silicon, such as germanium. Thus, the terms "substrate" or "semiconductor substrate" should be understood to cover all semiconducting materials and all forms of such materials. The substrate 205 may have different layers. For example, the fins 210, 215 may be formed in a process layer formed above the base layer of the substrate 205.

In one illustrative embodiment, a replacement technique is used to form source/drain contacts for the fins 210, 215.

Placeholder (or sacrificial) contact structures 235, each including a placeholder material 240 (e.g., polysilicon) and a cap layer 245 (e.g., silicon nitride) were formed above the fins 210, 215 in the source/drain regions. A layer of placeholder material 240 and a layer of cap layer 245 material were deposited and patterned to define the placeholder contact structures 235 in the source/drain regions of the fins 210, 215. The size of the placeholder contact structures 235 may vary depending upon the particular application.

Figure 2B:
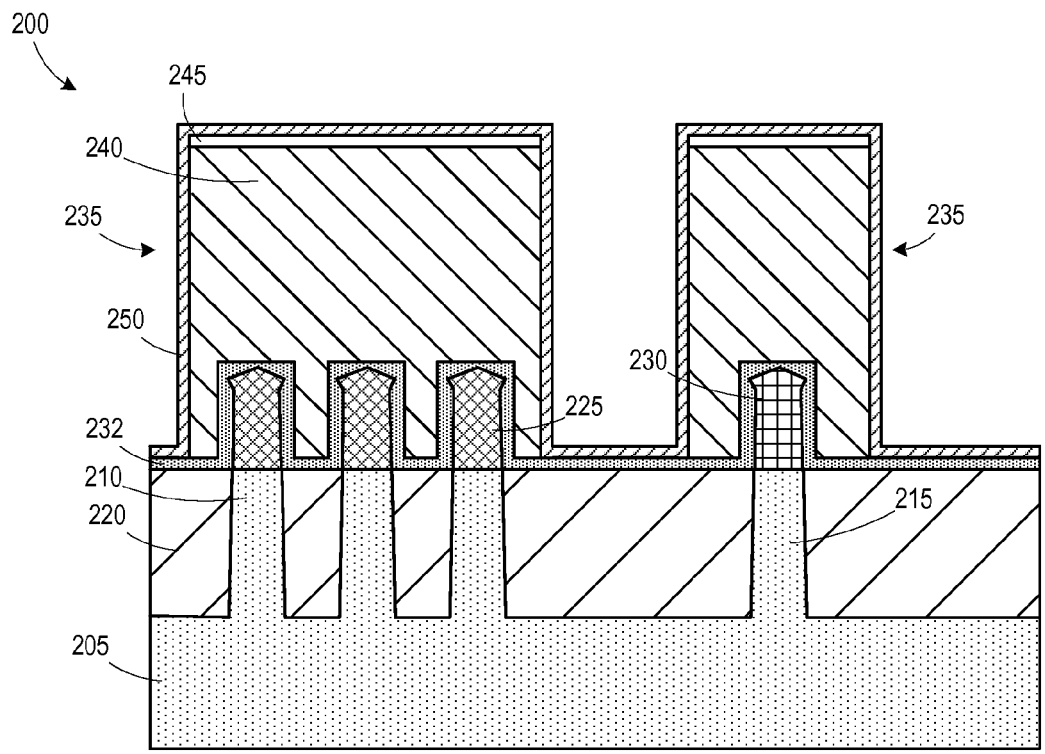

FIG. 2B illustrates the product 200 after a conformal deposition process was performed to form a liner 250 (e.g., SiOC, SiCON) above the placeholder contact structures 235. In one embodiment, the liner 250 may have a thickness that falls within the range of about 2-10 nm.

Figure 2C:
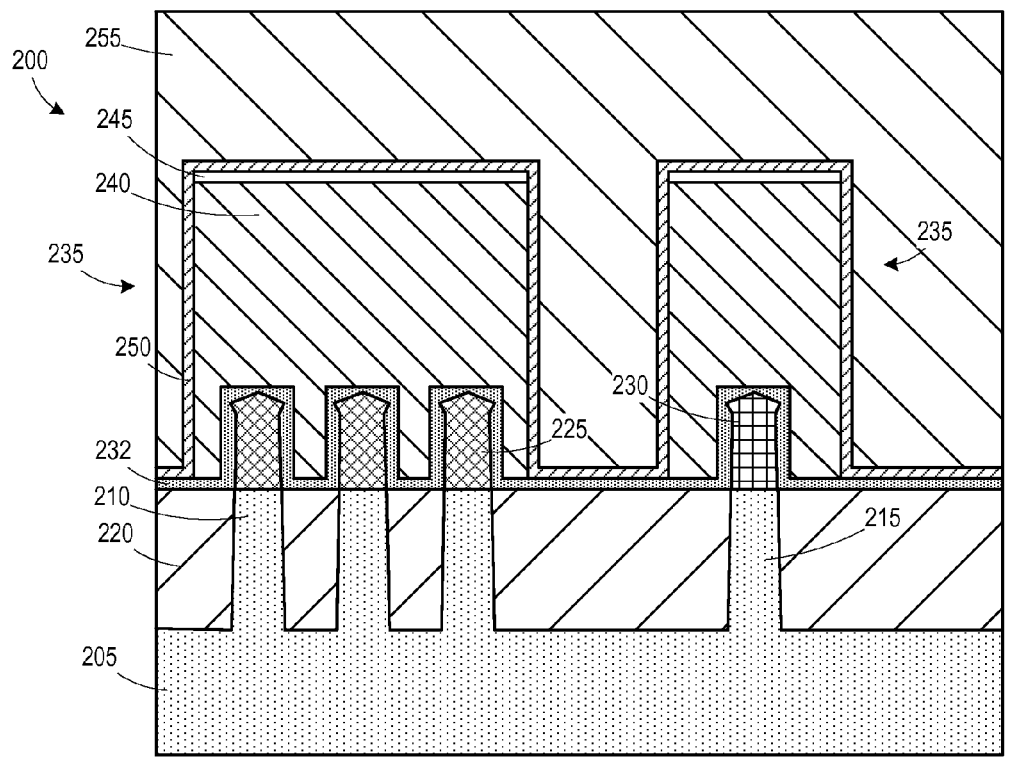

FIG. 2C illustrates the product 200 after a deposition process was performed to form a dielectric layer 255 (e.g., a polymer dielectric material such as Tonen SilaZene (TOSZ)) over the liner 240. The material of the dielectric layer 255 may vary and it may be selected for its gap-filling characteristics and its polishing rate characteristics. Generally, a material that allows a relatively high polishing rate reduces topography variations across the substrate 205 after a planarization process is performed.

Figure 2D:
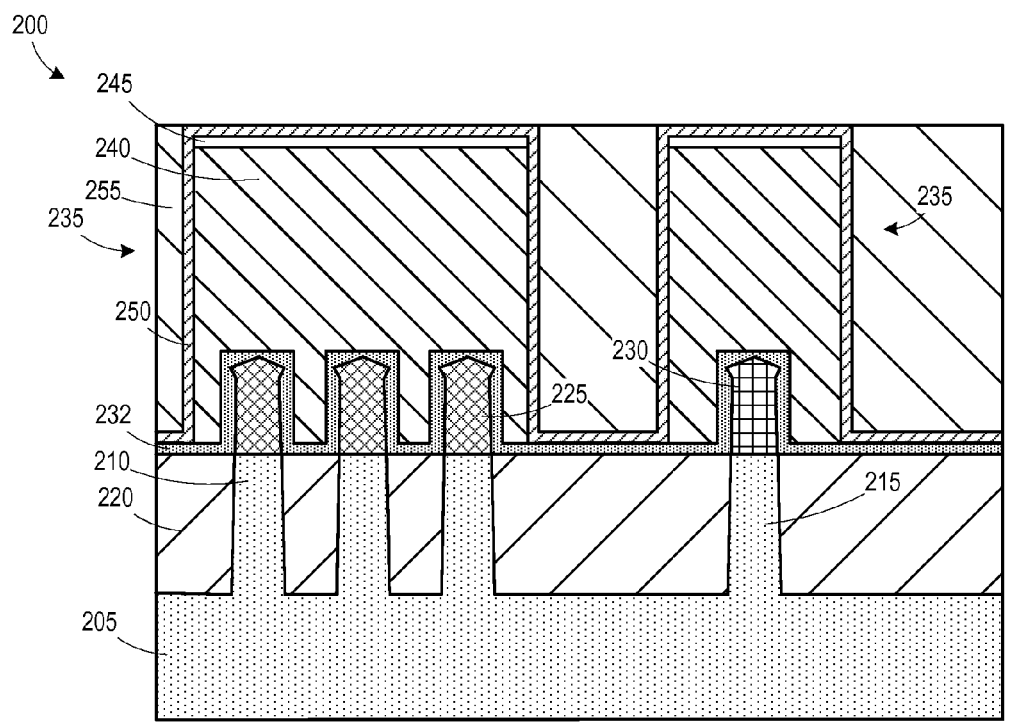

FIG. 2D illustrates the product 200 after a planarization process was performed to planarize the dielectric layer 255 and expose the liner 250.

Figure 2E:
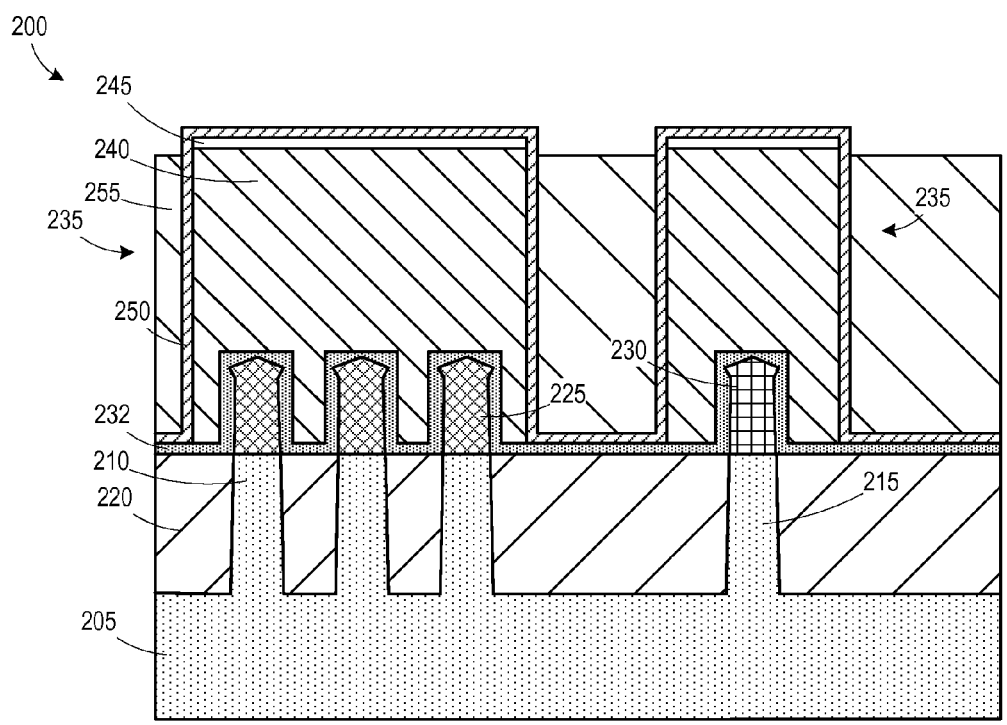

FIG. 2E illustrates the product 200 after a timed recess etching process was performed to recess the dielectric layer 255 to a level below a bottom surface of the cap layer 245. The amount of recessing may vary depending upon the particular application.

Figure 2F:
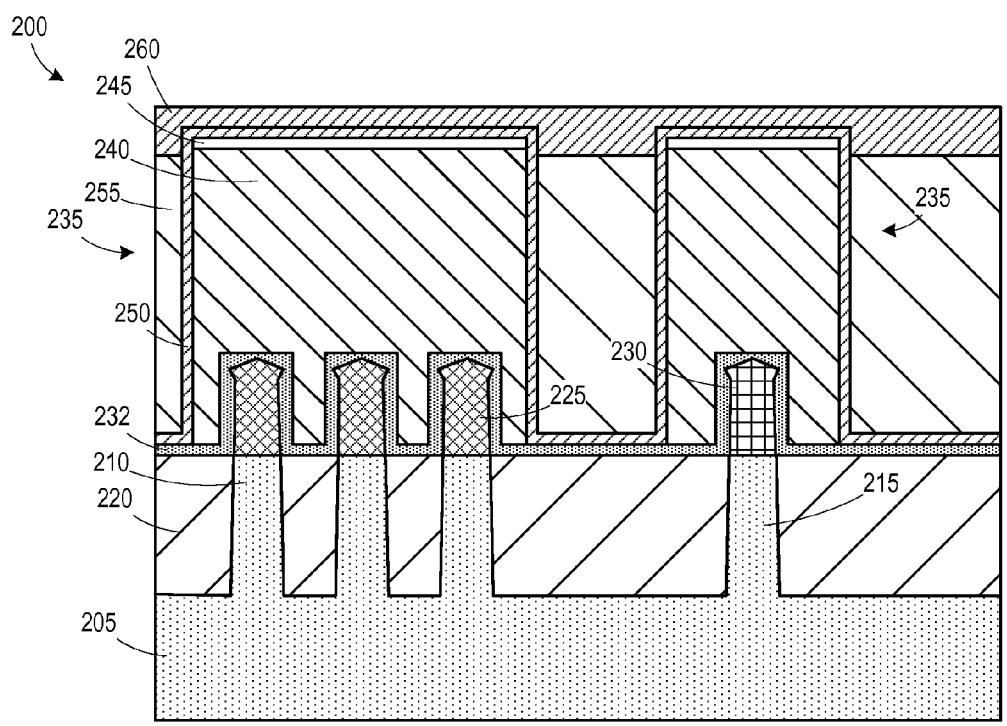

FIG. 2F illustrates the product 200 after a deposition process was performed to form an additional cap layer 260 (e.g., SiOC, SiCON) above the liner 250 and the dielectric layer 255. In one embodiment, the cap layer 260 may have a thickness that falls within the range of about 10-30 nm. In some applications, the cap layer 260 and the liner 250 may be made of the same material, but that is not required in all applications. In general, the cap layer 260 should be a material that exhibits good etch selectivity relative to the materials of the cap layer 245 and the dielectric layer 255.

Figure 2G:
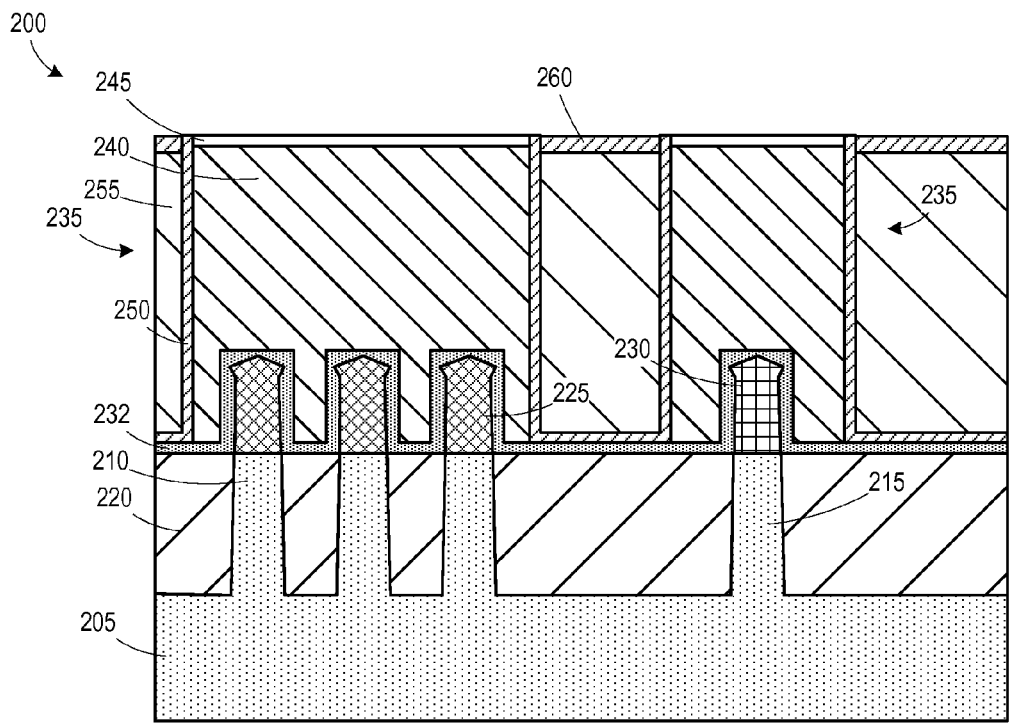

FIG. 2G illustrates the product 200 after a planarization process was performed on the cap layer 260 and the liner 250 to expose the cap layer 245.

Figure 2H:
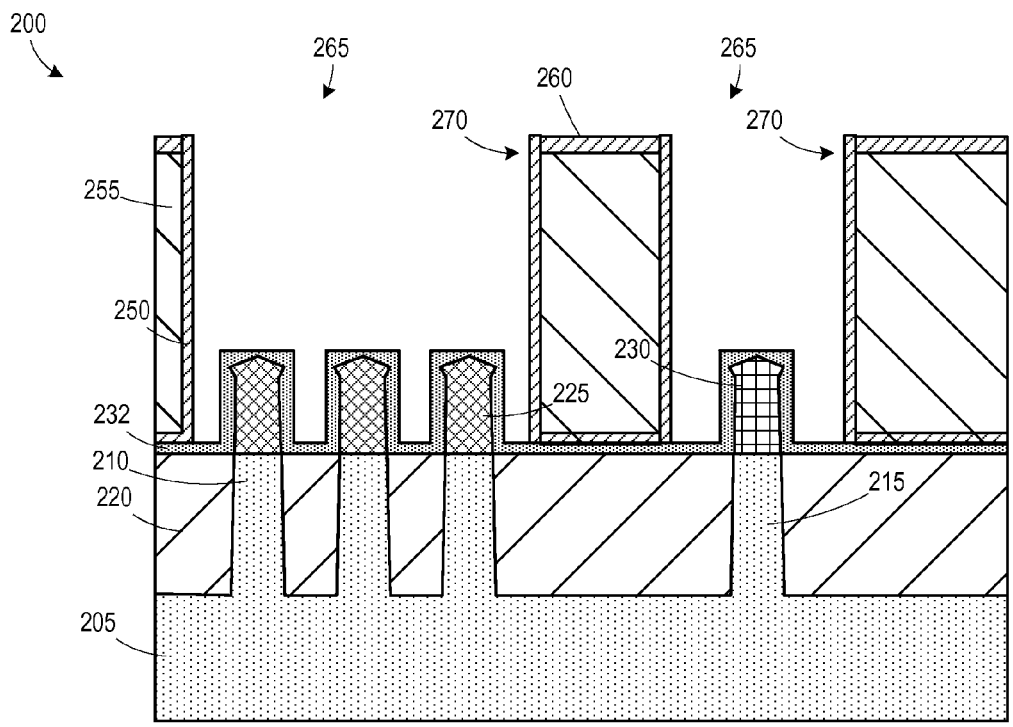

FIG. 2H illustrates the product 200 after multiple etch processes were performed to remove the cap layer 245 and the placeholder material 240, thereby creating source/drain contact recesses 265 exposing the contact etch stop layer 232 above the fins 210, 215 in the source/drain regions of the devices. The liner 250 and the cap layer 260 protect the dielectric layer 255 during the etch processes to avoid affecting the CD of the recesses thereby created.

Figure 2I:
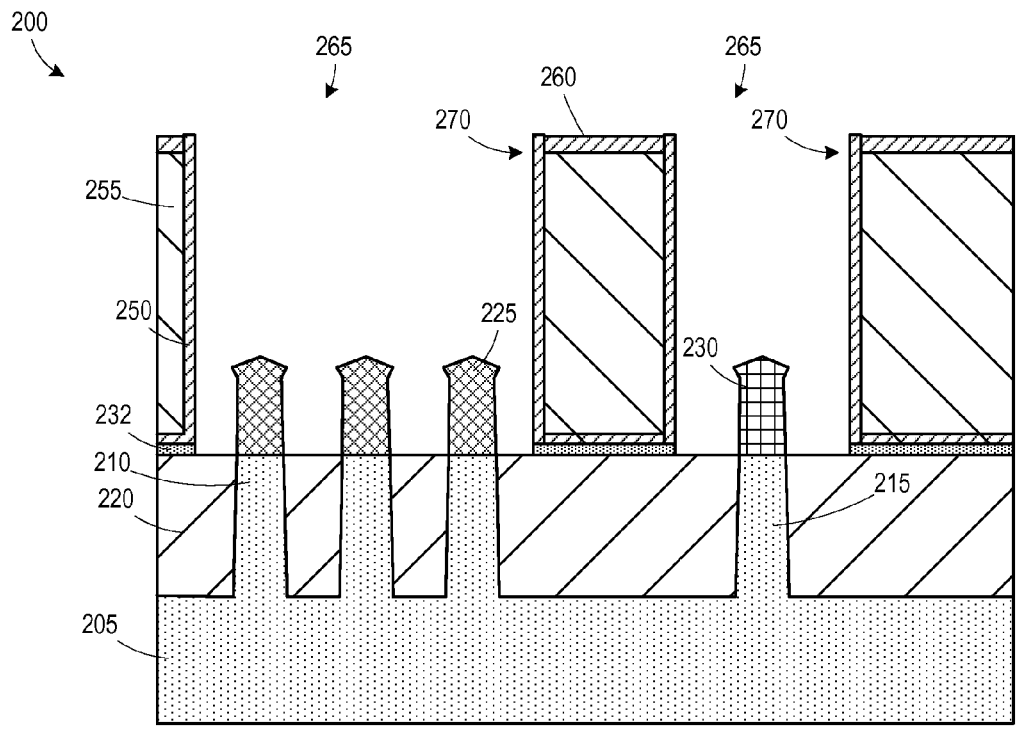

FIG. 2I illustrates the product after an etch process was performed to remove exposed portions of the contact etch stop layer 232, thereby exposing the epitaxial material 225, 230. The liner 250 and the cap layer 260 also protect the dielectric layer 255 during this etch process.

Recessing the dielectric layer 255 prior to forming the cap layer 260 enhances the protection in corner regions 270 of the dielectric layer 255 during the etch processes of FIGS. 2H and 2I.

Figure 2J:
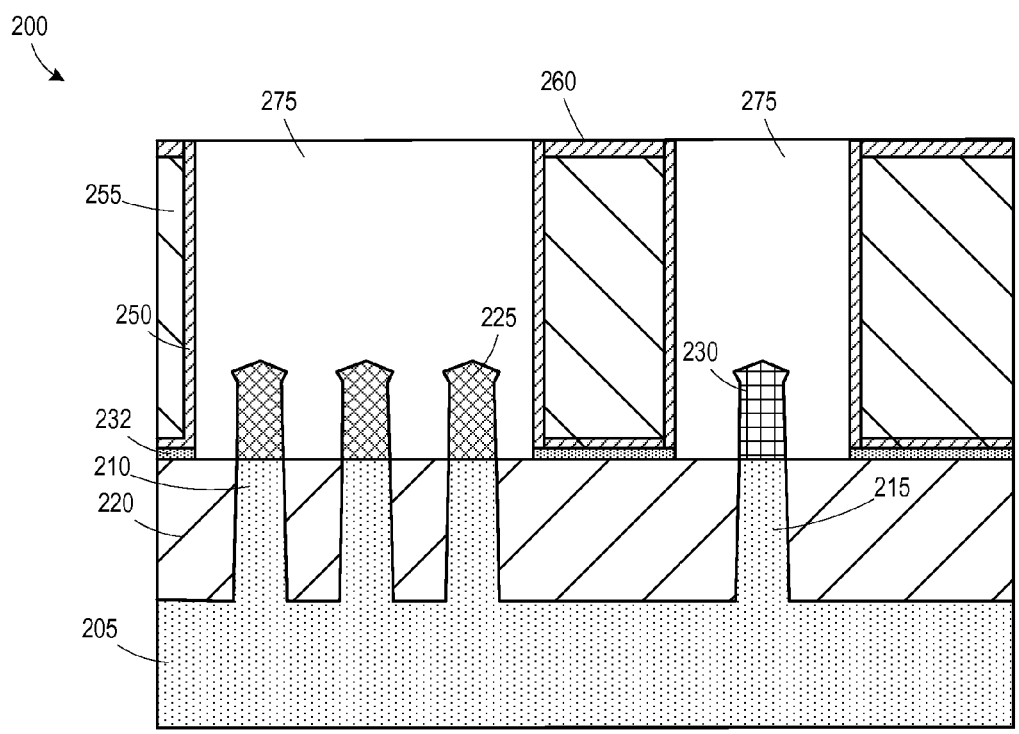

FIG. 2J illustrates the integrated circuit product 200 after multiple processes were performed to form conductive contacts 275 in the source/drain contact recesses 265. The conductive contacts 275 may include multiple layers, such as one or more barrier layers (e.g., Ta, TaN, TiN, etc.) to prevent migration of any metal in the conductive contacts 275 into the liner 250 or the dielectric layer 255, a metal seed layer (e.g., copper), a metal fill material (e.g., copper), a metal silicide material, etc. The processes for forming the conductive contacts 275 may include a planarization process to remove excess conductive material disposed outside the recesses 265. This planarization process may terminate on the cap layer 260 as illustrated in FIG. 2J, or alternatively, the planarization process may terminate on the top surface of the dielectric layer 255, thereby removing the cap layer 260 (not shown).

Other processes may be performed to complete fabrication of the product 200. Subsequent metallization layers and interconnect lines and vias may be formed. Other layers of material may be present, but are not depicted in the attached drawings.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
   forming a placeholder source/drain contact structure above a semiconductor material;
   performing a conformal deposition process to form a liner layer above said placeholder source/drain contact structure;
   forming a dielectric layer above said liner layer;
   performing a first planarization process to remove material of said dielectric layer and expose a first top surface of said liner layer above said placeholder source/drain contact structure;
   forming a first cap layer above said dielectric layer and said first top surface;
   performing a second planarization process to remove material of said first cap layer and said liner layer to expose a second top surface of said placeholder source/drain contact structure;
   removing said placeholder source/drain contact structure to define a source/drain contact recess in said dielectric layer, wherein sidewalls of said dielectric layer in said source/drain contact recess are covered by said liner layer; and
   forming a conductive material in said source/drain contact recess.

2. The method of claim 1, wherein said liner layer and said first cap layer comprise the same material.

3. The method of claim 2, wherein said liner layer and said first cap layer comprise at least silicon, oxygen and carbon.

4. The method of claim 3, wherein said liner layer and said first cap layer comprise nitrogen.

5. The method of claim 1, wherein said placeholder contact structure comprises a placeholder material formed above said semiconductor material and a second cap layer formed above said placeholder material.

6. The method of claim 5, wherein said second cap layer comprises silicon nitride.

7. The method of claim 1, further comprising recessing said dielectric layer prior to forming said first cap layer.

8. The method of claim 7, wherein said placeholder contact structure comprises a placeholder material formed above said semiconductor material and a second cap layer formed above said placeholder material and recessing said dielectric layer comprises recessing said dielectric layer to a level below a bottom surface of said second cap layer.

9. The method of claim 1, further comprising:
   forming a contact etch stop layer above said semiconductor material prior to forming said placeholder contact structure, wherein removing said placeholder contact structure comprises exposing said contact etch stop layer; and
   removing a portion of said contact etch stop layer exposed by said recess to expose said semiconductor material.

10. The method of claim 1, wherein said semiconductor material comprises at least one fin defined in a semiconductor substrate.

11. A method, comprising:
    forming a fin in a semiconductor substrate;
    forming a placeholder contact structure above said fin, said placeholder contact structure comprising a placeholder material and a first cap layer formed above said placeholder material;
    performing a conformal deposition process to form a liner layer above said placeholder contact structure;
    forming a dielectric layer above said liner layer;
    performing a first planarization process to remove material of said dielectric layer and expose a first top surface of said liner layer above said placeholder contact structure;
    recessing said dielectric layer to a level below a bottom surface of said first cap layer;
    forming a second cap layer above said dielectric layer and said first top surface;
    performing a second planarization process to remove material of said second cap layer and said liner layer to expose said first cap layer;
    removing said first cap layer and said placeholder material to define a recess in said dielectric layer, wherein sidewalls of said dielectric layer in said recess are covered by said liner layer; and
    forming a conductive material in said recess.

12. The method of claim 11, wherein said liner layer and said first cap layer comprise the same material.

13. The method of claim 12, wherein said liner layer and said first cap layer comprise SiOC.

14. The method of claim 11, wherein said first cap layer comprises silicon nitride.

15. The method of claim 11, further comprising:
    forming a contact etch stop layer above said fin prior to forming said placeholder contact structure, wherein removing said placeholder material comprises exposing said contact etch stop layer; and
    removing a portion of said contact etch stop layer exposed by said recess to expose said fin.

* * * * *